US009095898B2

(12) United States Patent
Zinn

(10) Patent No.: US 9,095,898 B2
(45) Date of Patent: Aug. 4, 2015

(54) STABILIZED METAL NANOPARTICLES AND METHODS FOR PRODUCTION THEREOF

(75) Inventor: Alfred A. Zinn, Palo Alto, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 1000 days.

(21) Appl. No.: 13/228,411

(22) Filed: Sep. 8, 2011

(65) Prior Publication Data

US 2012/0114521 A1    May 10, 2012

Related U.S. Application Data

(63) Continuation-in-part of application No. 12/512,315, filed on Jul. 30, 2009, now Pat. No. 8,105,414, and a continuation-in-part of application No. 12/813,463, filed on Jun. 10, 2010, now Pat. No. 8,486,305.

(60) Provisional application No. 61/437,556, filed on Jan. 28, 2011, provisional application No. 61/097,175, filed on Sep. 15, 2008, provisional application No. 61/265,326, filed on Nov. 30, 2009.

(51) Int. Cl.
| | |
|---|---|
| B22F 9/24 | (2006.01) |
| B22F 1/00 | (2006.01) |
| B82Y 30/00 | (2011.01) |
| H05K 1/09 | (2006.01) |
| H05K 3/12 | (2006.01) |

(52) U.S. Cl.
CPC ............. *B22F 1/0018* (2013.01); *B22F 1/0062* (2013.01); *B22F 9/24* (2013.01); *B82Y 30/00* (2013.01); *H05K 1/097* (2013.01); *B22F 2999/00* (2013.01); *H05K 3/125* (2013.01); *H05K 2201/0218* (2013.01); *H05K 2201/0257* (2013.01); *H05K 2203/0514* (2013.01); *H05K 2203/107* (2013.01)

(58) Field of Classification Search
CPC ............... B22F 1/0018; B22F 2999/00; B22F 2301/10; B22F 2304/054; B22F 1/0062
USPC .......................................................... 75/343
See application file for complete search history.

(56) References Cited

U.S. PATENT DOCUMENTS

| | | | |
|---|---|---|---|
| 3,332,916 A | 7/1967 | Hay | |
| 3,637,508 A | 1/1972 | Willsey et al. | |
| 5,147,841 A | 9/1992 | Wilcoxon | |
| 5,159,171 A | 10/1992 | Cook et al. | |
| 6,645,444 B2 | 11/2003 | Goldstein | |
| 6,783,569 B2 | 8/2004 | Cheon et al. | |
| 7,306,823 B2 | 12/2007 | Sager et al. | |
| 7,419,887 B1 | 9/2008 | Quick et al. | |
| 7,524,351 B2 | 4/2009 | Hua et al. | |
| 7,559,970 B2 | 7/2009 | Kim et al. | |
| 7,628,840 B2 | 12/2009 | Atsuki et al. | |
| 7,637,982 B2 | 12/2009 | Hou et al. | |
| 7,736,414 B1 | 6/2010 | Zinn | |
| 7,847,397 B2 | 12/2010 | Wu et al. | |
| 7,850,933 B2 | 12/2010 | Yang et al. | |
| 7,858,025 B2 | 12/2010 | Shim et al. | |
| 7,968,008 B2 * | 6/2011 | Parashar et al. | ............... 252/500 |
| 2006/0073667 A1 * | 4/2006 | Li et al. | ........................ 438/311 |
| 2007/0202304 A1 | 8/2007 | Golovko et al. | |
| 2007/0290175 A1 | 12/2007 | Kim | |
| 2008/0003364 A1 | 1/2008 | Ginley et al. | |
| 2008/0011125 A1 | 1/2008 | Shirata et al. | |
| 2008/0032132 A1 | 2/2008 | Woodfield et al. | |
| 2008/0072706 A1 | 3/2008 | Lee et al. | |
| 2008/0124268 A1 | 5/2008 | Yang et al. | |
| 2008/0149176 A1 | 6/2008 | Sager et al. | |
| 2008/0151515 A1 | 6/2008 | Das et al. | |
| 2008/0159902 A1 | 7/2008 | Shim et al. | |

(Continued)

FOREIGN PATENT DOCUMENTS

| | | |
|---|---|---|
| EP | 2098316 A2 | 9/2009 |
| JP | 2009-062598 A | 3/2009 |
| WO | WO-2006/057467 A1 | 6/2006 |
| WO | WO 2009/115643 | 9/2009 |
| WO | WO-2010/030487 A1 | 3/2010 |
| WO | WO 2010/036114 | 4/2010 |

OTHER PUBLICATIONS

Kanninen, et al., "Influence Of Ligand Structure On The Stability And Oxidation Of Copper Nanoparticles", Journal Of Colloid And Interface Science 318 (2008) pp. 88-95.
Lisiecki, et al., "Control Of The Shape And The Size Of Copper Metallic Particles", J. Phys. Chem 1996, 100, pp. 4160-4166.
Mott, et al., "Synthesis Of Size-Controlled And Shaped Copper Nanoparticles", Langmuir 2007, 23, pp. 5740-5745.
Wu, et al., "Simple One-Step Synthesis Of Uniform Disperse Copper Nanoparticles", Mater. Res. Soc. Symp. Proc. vol. 879E, 2005 Materials Research Society, pp. Z6.3.1-Z6.3.6.

(Continued)

*Primary Examiner* — George Wyszomierski
*Assistant Examiner* — Ngoclan T Mai
(74) *Attorney, Agent, or Firm* — McDermott Will & Emery LLP

(57) ABSTRACT

Processes for synthesizing metal nanoparticles, particularly copper nanoparticles, are described. The processes can involve reacting an insoluble complex of a metal salt with a reducing agent in a reaction mixture containing a primary amine first surfactant, a secondary amine second surfactant, and a diamine chelating agent third surfactant. More specifically, processes for forming copper nanoparticles can involve forming a first solution containing a copper salt, a primary amine first surfactant, a secondary amine second surfactant, and a diamine chelating agent third surfactant; allowing an insoluble complex of the copper salt to form from the first solution; combining a second solution containing a reducing agent with the insoluble complex; and forming copper nanoparticles from the insoluble complex. Such copper nanoparticles can be about 10 nm or smaller in size, more particularly about 3 nm to about 6 nm in size, and have a fusion temperature of about 200° C. or lower.

40 Claims, 4 Drawing Sheets

(56) References Cited

U.S. PATENT DOCUMENTS

| | | | |
|---|---|---|---|
| 2008/0230750 | A1 | 9/2008 | Gillies et al. |
| 2008/0278181 | A1 | 11/2008 | Zhong et al. |
| 2009/0029148 | A1 | 1/2009 | Hashimoto et al. |
| 2009/0214764 | A1 | 8/2009 | Li et al. |
| 2009/0239073 | A1 | 9/2009 | Huang et al. |
| 2009/0301606 | A1 | 12/2009 | Ueshima |
| 2010/0065616 | A1 | 3/2010 | Zinn |
| 2010/0075137 | A1 | 3/2010 | Sinton |
| 2010/0139455 | A1 | 6/2010 | Tilley et al. |
| 2010/0275729 | A1 | 11/2010 | Jun et al. |
| 2010/0314578 | A1 | 12/2010 | Purdy |

OTHER PUBLICATIONS

Wu, et al., "One-Step Green Route To Narrowly Dispersed Copper Nanocrystals", Journal of Nanoparticle Research (2006) pp. 965-969.

Yeshchenko, et al., "Size-Dependent Melting Of Spherical Copper Nanoparticles Embedded In A Silica Matrix", Physical Reviews B 75 (2007) pp. 085434-1 to 085434-6.

Pulkkinen, et al., "Poly(ethylene imine) And Tetraethylenepentamine As Protecting Agents For Metallic Copper Nanoparticles", Applied Materials & Interfaces, (2009) vol. 1, No. 2, pp. 519-525.

Product Description—"Copper Nanoparticle And Cupric Salt Product Specialized Team", Suzhou Cantuo Nano Technology Co. Ltd 2010.

Product Description—"Nano-Copper", Sun Innovations, Inc. 2005-2010.

Product Description—"Copper Nanoparticle, Cu", NaBond Technologies Co., Ltd. 2001-2009.

Product Description—"Copper Nanoparticles", American Elements 2001-2010.

Product Description—"Powders: Nanoparticles & Nanopowders", SkySpring Nanomaterials, Inc.

Product Description—"Copper Nano Powder" TradeKey 2011.

Product Description —Metal & Alloy Nanoparticles, Nanoshel 2007-2009.

Product Description—"Nanopowders" Sigma-Aldrich 2010.

Product Description—Copper Nanoparticle (Copper Nanopowder), Suzhou Canfuo Nano Technology Co., Ltd. 1997-2011.

Aslam, et al., "Formation of Cu and $Cu_2O$ Nanoparticles by Variation of the Surface Ligand: Preparation, Structure, and Insulating-to-Metallic Transition", Journal of Colloid and Interface Science, 2002, pp. 79-90.

Masala, et al., "Synthesis Routes For Large Volumes Of Nanoparticles", Annu. Rev. Mater. Res., 2004, pp. 41-81.

Gupta, Vaibhav, "Synthesis of Metallic Nanoparticles and Their Applications", Department of Research and Advanced Studies of the University of Cincinnati, 2006.

Kogiso, et al., "One-Dimensional Organization Of Copper Nanoparticles By Chemical Reduction Of Lipid-Copper Hybrid Nanofibers", The Royal Society of Chemistry 2002, pp. 2492-2493.

Yonezawa, et al., "The Preparation Of Copper Fine Particle Paste And Its Application As The Inner Electrode Material Of A Multilayered Ceramic Capacitor", Nanotechnology 19 (2008) 145706, pp. 1-5.

Foresti , et al., "New Thiophene Monolayer Protected Copper Nanoparticles: Synthesis and Chemical-Physical Characterization", Department of Chemistry "G. Ciamician" Alma Mater Studiorum Bologna University.

Murai, et al., "Preparation Of Copper Nanoparticles With An Organic Coating By A Pulsed Wire Discharge Method", Journal of Ceramic Processing Research, 2007, vol. 8, No. 2, pp. 114-118.

Jiang, et al., "Size-Dependent Melting Properties Of Tin Nanoparticles", Chemical Physics Letters, 2006, pp. 492-496, vol. 429, Science Direct.

M. Attarian Shandiz, Effective Coordination Number Model for the Size Dependency of Physical Properties of Nanocrystals, Journal of Physics: Condensed Matter, 2008, pp. 1-9, 20, IOP Publishing.

Mostafa Mirjalili, et al. Prediction of Nanoparticles' Size-Dependent Melting Temperature Using Mean Coordination Number Concept, Journal of Physics and Chemistry of Solids, 2008, pp. 2116-2123, 69.

Office Action in corresponding U.S. Appl. No. 12/512,315, dated Apr. 8, 2011.

U.S. Appl. No. 12/512,315.
U.S. Appl. No. 12/813,463.
U.S. Appl. No. 11/798,529.
U.S. Appl. No. 12/426,160.

Chu et al., "Thermal Aqueous Solution Approach for the Synthesis of Triangular and Hexagonal Gold Nanoplates with Three Different Size Ranges", Inorganic Chemistry, 2006, pp. 808-813, vol. 45.

\* cited by examiner

STABILIZED METAL NANOPARTICLES AND METHODS FOR PRODUCTION THEREOF

CROSS-REFERENCE TO RELATED APPLICATIONS

This application claims the benefit of priority under 35 U.S.C. §119 from U.S. Provisional Patent Application 61/437,556, filed Jan. 28, 2011, which is incorporated herein by reference in its entirety. This application is also a continuation-in-part of U.S. patent application Ser. No. 12/512,315, filed Jul. 30, 2009, now U.S. Pat. No. 8,105,414 which claims priority to U.S. Provisional Patent Application 61/097,175, filed Sep. 15, 2008, each of which is incorporated herein by reference in its entirety. The application is also a continuation-in-part of U.S. patent application Ser. No. 12/813,463, filed Jun. 10, 2010, now U.S. Pat. No. 8,486,305, which claims priority to U.S. Provisional Patent Application 61/265,326, filed Nov. 30, 2009, each of which is incorporated herein by reference in its entirety.

STATEMENT REGARDING FEDERALLY SPONSORED RESEARCH OR DEVELOPMENT

Not applicable.

FIELD OF THE INVENTION

The present invention generally relates to metal nanoparticles, and, more particularly, to scalable processes for the production of metal nanoparticles.

BACKGROUND

Although lead has been traditionally used in numerous industrial applications, current regulations have required the phase out of lead in most commercial products. For example, the European Union issued regulations in 2006 that mandated the elimination of lead from coatings and solders used in most electronic components. Other countries have issued similar mandates.

Electronics and like connections made using lead-based soldering materials are typically very reliable, and large capital investments have been made in associated manufacturing infrastructure. The worldwide phase out lead-based soldering materials has raised serious concerns regarding the reliability of alternative soldering materials and methods. Although many alternatives to traditional lead-based soldering materials have been developed, the Sn/Ag/Cu (SAC) system being among the most widely used, such replacements have typically exhibited drawbacks that make them unsuitable for extreme environments such as those found in automotive, military and space vehicles, for example. Specifically, the SAC system has a significantly higher eutectic melting point (e.g., m.p. of ~217° C.) than does traditional Sn/Pb solder (m.p. of 183° C. for 63/37 Sn/Pb or 188° C. for 60/40 Sn/Pb), thus limiting its use to materials that are capable of withstanding its higher processing temperature. Furthermore, silver is a relatively expensive component in the SAC system, and there is insufficient silver production capacity to totally replace lead-based soldering materials with the SAC system. From an economic standpoint, the SAC system can undesirably lead to significantly higher production costs due to the material cost of silver and the more robust components needed to withstand its higher processing temperature. Even more importantly, SAC systems are prone to formation of tin whiskers, thereby increasing the risk of electrical shorting.

Several compositions containing metal nanoparticles have been proposed as replacements for traditional lead-based soldering materials. Nanoparticles can exhibit physical and chemical properties that sometimes differ significantly from those observed in the bulk material. For example, metal nanoparticles having a size of less than about 20 nm can exhibit a fusion temperature that is significantly below the melting point of the bulk metal. Copper nanoparticles, in particular, can have a fusion temperature that is comparable to that of traditional lead-based soldering materials. When copper nanoparticles are about 10 nm or less in size, the copper nanoparticles can have a fusion temperature of about 200° C. or less, thereby providing processing temperatures that are comparable with traditional lead-based soldering materials. Copper nanoparticles can also be considered as replacements for high temperature soldering materials such as AuSn, since they provide an initial low fusion temperature and a significantly higher reflow temperature thereafter.

Although copper nanoparticles are of significant interest due to their compatibility with existing soldering methods, the formation of monodisperse copper nanoparticles remains synthetically challenging, particularly at bulk scales required for commercial production. Further, it can be difficult to reversibly protect copper nanoparticles in order to prevent their agglomeration with one another. Protection can sometimes be accomplished with a thin oxide coating or a surfactant, including polymers such as polyvinylpyrrolidone, but oftentimes these agents cannot be effectively removed in order that the copper nanoparticles can function as desired in soldering applications. In addition, these agents can introduce contaminants or can themselves be considered contaminants that detrimentally impact the properties of copper nanoparticles. Properties that can be impacted can include, for example, electrical and thermal conductivity, mechanical strength, brittleness and fracture toughness.

In view of the foregoing, scaleable processes for the synthesis of monodisperse metal nanoparticles, particularly copper nanoparticles having a size of 10nm or less, would be of substantial benefit in the art. The present invention satisfies this need and provides related advantages as well.

SUMMARY

In various embodiments, processes described herein include reacting an insoluble complex of a metal salt with a reducing agent in a reaction mixture containing a first surfactant, a second surfactant, and a third surfactant so as to form metal nanoparticles. The first surfactant contains a primary amine. The second surfactant contains a secondary amine. The third surfactant contains a diamine chelating agent.

In other various embodiments, processes described herein include forming a first solution containing a copper salt, a first surfactant, a second surfactant, and a third surfactant; allowing an insoluble complex of the copper salt to form from the first solution; combining a second solution containing a reducing agent with the insoluble complex, thereby forming a reaction mixture; and forming copper nanoparticles from the insoluble complex. The first surfactant contains a primary amine. The second surfactant contains a secondary amine. The third surfactant contains a diamine chelating agent.

In some embodiments, copper nanoparticles produced by the processes described herein have a fusion temperature of about 200° C. or lower and contain at least some of a first surfactant, a second surfactant, and a third surfactant. The first surfactant contains a primary amine. The second surfactant contains a secondary amine. The third surfactant contains a diamine chelating agent.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
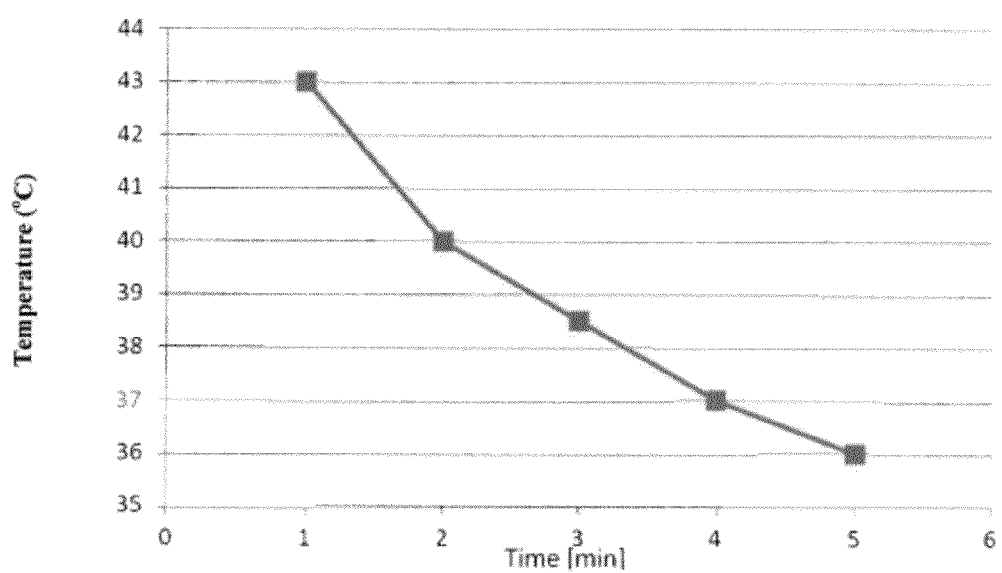
FIG. 1 shows an illustrative plot of the time required to form copper nanoparticles at various temperatures.

The present disclosure is directed, in part, to improved, scalable processes for the synthesis of metal nanoparticles, particularly copper nanoparticles. The present disclosure is also directed, in part, to metal nanoparticles, particularly copper nanoparticles, prepared by the processes described herein, where the metal nanoparticles contain a coating of at least one of a primary amine surfactant, a secondary amine surfactant, and/or a diamine chelating agent surfactant.

Processes described herein are related to and an improvement over those described in commonly owned U.S. Pat. No. 7,736,414, entitled "RHENIUM NANOPARTICLES" and Ser. No. 12/426,160, filed Apr. 17, 2009, entitled "CARBON NANOTUBE SYNTHESIS USING REFRACTORY METAL NANOPARTICLES AND MANUFACTURE OF REFRACTORY METAL NANOPARTICLES," each of which incorporated herein by reference in its entirety. The present processes also represent an improvement over those described in U.S. patent applications Ser. No. 12/512,315 and Ser. No. 12/813,463, to which the present application claims priority.

A primary advantage of the processes described herein is that the synthesis of metal nanoparticles, particularly copper nanoparticles, can be readily scaled from laboratory and small pilot scale quantities, as described in previous processes, to bulk scales needed for industrial production (e.g., hundreds to thousands of liter reactors and higher). The chief way that this feat is accomplished is through separation of the nucleation and growth processes that lead to metal nanoparticle formation. In prior procedures, nucleation and growth processes can be in competition with one another in a reaction mixture in which metal nanoparticles are being formed, in which case new metal nanoparticles are being continually formed while older metal nanoparticles continue to grow in size. As a result of these competing processes, a wide range of metal nanoparticles sizes can result.

While Applicant's previous metal nanoparticle syntheses are able to limit the size dispersity through careful control of the nucleation and growth processes, such control becomes considerably more difficult as the reaction scale becomes large. Non-limiting factors that can account for this loss of process control at larger scale include, for example, temperature fluctuations, mixing gradients, non-uniform nucleation site distribution (e.g., on the reactor walls and stirrer surfaces), local supersaturation and the like. According to the present embodiments, the nucleation and growth processes are separated from one another such that metal nanoparticle nucleation sites are allowed to form substantially completely from a reaction mixture before reduction and growth to form the metal nanoparticles subsequently takes place. Since metal nanoparticles are grown from a common solid precursor state (i.e., the nucleation sites) according to the present embodiments, the metal nanoparticle size can be varied by controlling the size of the nucleation sites. This is in contrast to other solution-based nanoparticle growth processes, where nanoparticle growth ramps up to a maximum growth rate, which then slowly declines while nanoparticle growth takes place, until the reaction is terminated after a desired length of time.

The present processes are also particularly advantageous in how the nucleation sites are generated, since they can be directly converted into a metal nanoparticle product. In contrast, a foreign nucleation agent may or may not be converted into metal nanoparticles, and the properties of the metal nanoparticle product can suffer as a result. In addition, foreign nucleation agents have to be first prepared in the correct size, which is smaller than the target nanoparticle size, since the desired nanoparticles are seeded on the foreign nucleation agent. In the nanoregime, this can be a very difficult and expensive approach. Further, the present embodiments can allow the nucleation sites to be uniformly distributed as an insoluble complex throughout a reaction mixture in which metal nanoparticle formation subsequently takes place.

In present embodiments, a combination of three surfactants is used to promote the scalability of a metal nanoparticle synthesis. Specifically, the three surfactants promote the formation of an insoluble metal complex (i.e., a coordination compound of a metal salt) that precipitates substantially uniformly from a reaction mixture in fine powder form with a substantially uniform particle size distribution. The particles of the insoluble metal complex can serve as metal nanoparticle nucleation sites. Once the insoluble metal complex has been formed, treatment thereof with a suitable reducing agent can lead to the formation of metal nanoparticles. Not only do the three surfactants promote the formation of the insoluble metal complex itself, but they also facilitate a greater initial solubility of metal salts used as precursors for forming the metal nanoparticles, thereby allowing smaller quantities of solvent to be used in the present processes. The use of smaller quantities of solvent is particularly advantageous from an industrial point of view. Specific details regarding the surfactants are set forth hereinafter.

In addition, the presently described processes provide improved procedures for isolating and purifying metal nanoparticles. These improved isolation and purification procedures are also particularly advantageous for developing an industrially scalable process.

Although the description that follows is directed to copper nanoparticles in some embodiments, is to be recognized that other types of metal nanoparticles can be prepared in a like manner through modifications that will be evident to one having ordinary skill in the art.

As previously described, metal nanoparticles produced by the present processes are particularly advantageous for soldering applications due to their fusion temperature that is lower than that of the melting point of the corresponding bulk metal. As used herein, the term "fusion temperature" refers to the temperature at which a metal nanoparticle liquefies, giving the appearance of melting. In one aspect, the fusion temperature of a metal nanoparticle can be adjusted by varying the nanoparticle size obtained from synthesis. For example, copper nanoparticles have a significantly lower fusion temperature than the melting point of bulk copper (1083° C.), with smaller diameter copper nanoparticles having lower fusion temperatures. Specifically, the fusion temperature of copper nanoparticles in a 2-6 nm size range can be approximately 200° C. or less, whereas at a nanoparticle size range of 40-50 nm, the fusion temperature can be about 750° C. Similarly, at a nanoparticle size range of 20-30 nm, the fusion temperature can be about 450° C.

It can be advantageous to use a substance such as copper nanoparticles as a soldering material due to its high electrical and thermal conductivity. Furthermore, it can be possible to lay down these metal nanoparticles on circuit boards as thin traces or in the form of ball grid arrays (BGA) having very fine pitch, thereby facilitating manufacturing of densely packed circuitry.

In addition, it is advantageous to use copper nanoparticles as a soldering material due to its ability to minimize coefficient of thermal expansion (CTE) mismatch with a substrate. Specifically, CTE mismatch can be minimized, in some embodiments, because electronic components such as vias, pins and bonding material can be all copper based. Furthermore, unlike SAC materials, copper nanoparticles do not exhibit whisker formation, thereby improving circuit board life and reliability. Still further, the use of copper nanoparticles also ensures high uniformity of material and very rapid fusion processes (<1 min.) for fast assembly processes. Finally, copper nanoparticles also offer the advantage of higher electrical and thermal conductivity compared to SAC materials and other lead-based solder replacements.

In various embodiments, processes described herein include reacting an insoluble complex of a metal salt with a reducing agent in a reaction mixture containing a first surfactant, a second surfactant, and a third surfactant so as to form metal nanoparticles. The first surfactant contains a primary amine. The second surfactant contains a secondary amine. The third surfactant contains a diamine chelating agent.

In various embodiments, processes for forming metal nanoparticles can include forming a first solution containing a metal salt, a first surfactant, a second surfactant, and a third surfactant; allowing an insoluble complex of the metal salt to form from the first solution; combining a second solution containing a reducing agent with the insoluble complex; and forming metal nanoparticles from the insoluble complex. The first surfactant contains a primary amine. The second surfactant contains a secondary amine. The third surfactant contains a diamine chelating agent.

In some embodiments, the metal nanoparticles can be copper nanoparticles. Other metal nanoparticles can be synthesized by modification of the presently described processes though modifications that will be evident to one having ordinary skill in the art.

In some embodiments, the insoluble complex can be formed from a coordination compound of the metal salt with at least one of the first surfactant, the second surfactant, and the third surfactant. Without being bound by theory or mechanism, it is believed that the bonding strength of the three surfactants is as follows: third surfactant>second surfactant>first surfactant. It is believed that the third surfactant displays the strongest bonding strength due to its ability to form a chelate ring with the metal ion. However, it is also possible that the third surfactant can bridge between metal centers. It is further believed that the second surfactant has a stronger bonding strength than does the first surfactant due its higher basicity conferred by the electron donating character of its second alkyl group on the amine nitrogen atom. The bonding strengths of the three surfactants can also be influenced by steric hinderance near their amine groups. The first and second surfactants are both monodentate amine ligands and are expected to bond to the metal ion much less strongly that does the third surfactant. However, this feature can facilitate the removal of the first and second surfactants from the metal nanoparticles during soldering applications.

In the present embodiments, it has been observed that the second surfactant can play a particular role to initially solubilize the metal salt in a reaction mixture containing an organic solvent. This feature is highly beneficial for the scalable processes described herein, since it allows an insoluble complex of the metal salt to be formed uniformly from a solution. Although the present processes can be carried out without the second surfactant, it has been determined that much more reliable results are obtained when the second surfactant is used.

In some embodiments, processes described herein can be carried out in a suitable solvent, particularly an organic solvent. The organic solvent can be anhydrous in some embodiments (e.g., about 200 ppm water or lower). In some embodiments, the organic solvent can be substantially oxygen free. In general, the organic solvent can be any polar aprotic solvent that is capable of at least partially solubilizing a copper salt and a reducing agent. The solubility can be further aided by the surfactants, as described previously.

Suitable organic solvents for solubilizing metal salts and forming metal nanoparticles can include, for example, formamide, N,N-dimethylformamide, dimethyl sulfoxide, dimethylpropylene urea, hexamethylphosphoramide, tetrahydrofuran, and methyl or ethyl ethers of glyme, diglyme, triglyme, and tetraglyme. In some embodiments, the organic solvent can be diglyme or triglyme, which readily dissolves a number of metal salts (e.g. copper salts) while also activating reducing agents such as sodium borohydride ($NaBH_4$). By contrast, simple ethers, like diethyl ether, do not readily dissolve such a reducing agent to produce a highly reactive form. However, simple ethers can still be used in some embodiments, since the first surfactant and the second surfactant can help dissolve the metal salt. In some embodiments, the presence of the second surfactant (e.g., a secondary amine) and the first surfactant (e.g., a C4-C18 primary alkylamine), or a combination of these surfactants can enhance the solubility of the metal salt (e.g., a copper salt) through the initial formation of a soluble metal-organic ligand complex that subsequently uniformly precipitates from the reaction mixture as an insoluble complex in fine powder form once the third surfactant is added.

In some embodiments described herein, the insoluble complex can be formed from the same organic solvent in which the reducing agent is dissolved. In other embodiments, the insoluble complex can be formed from a different organic solvent than the organic solvent in which the reducing agent is dissolved. For example, high concentrations of $NaBH_4$ of up to about 3 M can be achieved in triglyme solvent to produce highly reactive $BH_4^-$ ions in solution. However, this solvent is somewhat expensive. If desired, the insoluble complex can be formed in a cheaper solvent such as, for example, THF, glyme, diglyme, or the like and then combined with the solution of the reducing agent in a more expensive solvent. This can beneficially reduce solvent handling volumes, facilitate scale-up, and reduce overall production costs at the industrial level.

In general, formation of the insoluble complex takes place from a first solution containing the first surfactant, the second surfactant, and the third surfactant. The insoluble complex can be isolated, if desired, or reacted in situ with a reducing agent to form the metal nanoparticles. There can be considerable experimental variability for the order in which the surfactants and the metal salt are added to form the first solution. In general, the metal salt is dissolved in a solvent prior to addition of the third surfactant. In some embodiments, the first surfactant, the second surfactant, and the third surfactant are added sequentially to a solvent, with the metal salt being added before either the first surfactant or second surfactant, between the first surfactant and the second surfactant, or after the second surfactant. In either case, the third surfactant is added thereafter. In some embodiments, the second surfactant can be added prior to the first surfactant. In some embodiments, the first surfactant and the second surfactant can be added to a solvent simultaneously, with the metal salt being added either before or after. In some embodiments, the metal salt can be first dissolved in a solvent, and a mixture of all three surfactants can be added thereafter to form the first solution.

Formation of the insoluble complex can take place over a wide temperature range. In general, formation of the insoluble complex can take place between about room temperature and below (about 25° C. and below) up to a temperature of about 85° C. Higher formation temperatures can be achieved in higher boiling solvents. In some embodiments, formation of the insoluble complex can take place at a temperature of at most about 85° C. Formation of the insoluble complex can take place at a temperature of at most about 70° C. in other embodiments, or at most about 50° C. in other embodiments, or at most about 40° C. in still other embodiments, or at most about 35° C. in still other embodiments, or at most about 30° C. in still further embodiments. In general, longer mixing times can sometimes be needed at lower temperatures to fully dissolve the metal salt prior to formation of the insoluble complex. In general, for scalable commercial processes, faster reaction times are preferred to minimize reactor time. It is to be noted that if the temperature is too high, aggregation of the initially formed metal nanoparticles can occur to form larger particles, particularly at longer reaction times.

Generally, the reaction to form metal nanoparticles can be complete in a few minutes at the above temperatures. In some embodiments, the reaction to form metal nanoparticles can take place for at most about 30 minutes. In other embodiments, the reaction to form metal nanoparticles can take place for at most about 20 minute, or at most about 15 minutes in other embodiments, or at most about 10 minutes in other embodiments, or at most about 5 minutes in some embodiments, or at most about 4 minutes in some embodiments, or at most about 3 minutes in some embodiments, or at most about 2 minutes in some embodiments, or at most about 1 minute in still other embodiments. As a specific example, the reaction to form copper nanoparticles can be complete in about 1 minute at about 42° C., whereas the reaction can be complete in about 2 minutes at about 40° C. and about 3-4 minutes at about 38° C. FIG. 1 shows an illustrative plot of the time required to form copper nanoparticles at various temperatures. It should be noted that the reaction rate can be sensitive to the moisture content of the reaction mixture, as small amounts of moisture can scavenge the reducing agent.

In some embodiments, processes described herein utilize a first surfactant that contains a primary alkylamine. In some embodiments, the primary alkylamine can be a C4-C18 alkylamine. In some embodiments, the primary alkylamine can be a C7-C10 alkylamine. In alternative embodiments, a C5-C6 alkylamine can also be used. Without being bound by theory or mechanism, the exact size of the primary alkylamine can be balanced between being long enough to provide an effective inverse micelle structure versus having ready volatility and/or ease of handling. For example, primary alkylamines with more than 18 carbons can also be suitable for use in the present embodiments, but they can be more difficult to handle because of their waxy character. C7-C10 primary alkylamines, in particular, can represent a good balance of desired properties for ease of use.

In some embodiments, the C4-C18 primary alkylamine can be n-heptylamine. In some embodiments, the C4-C18 primary alkylamine can be n-octylamine. In some embodiments the C4-C18 primary alkylamine can be n-nonylamine. While these are all normal chain primary alkylamines, branched chain primary alkylamines can also be used in other embodiments. For example, branched chain primary alkylamines such as, for example, 7-methyloctylamine, 2-methyloctylamine, or 7-methylnonylamine can be used. In some embodiments, such branched chain primary alkylamines can be sterically hindered where they are attached to the amine nitrogen atom. Non-limiting examples of such sterically hindered primary alkylamines can include, for example, t-octylamine, 2-methylpentan-2-amine, 2-methylhexan-2-amine, 2-methylheptan-2-amine, 3-ethyloctan-3-amine, 3-ethylheptan-3-amine, 3-ethylhexan-3-amine, and the like. Additional branching can also be present. Without being bound by theory, it is believed that the foregoing primary alkylamines can serve as ligands in the coordination sphere of metal ions, particularly copper ions. However, their ability to dissociate from the metal center is facilitated by their single point of attachment. In the case of primary alkylamines having significant steric encumbrance, the bulky groups near the amine nitrogen can further reduce the bonding strength and facilitate dissociation from the metal center.

In some embodiments, processes described herein can utilize a second surfactant that contains a secondary amine. In various embodiments, secondary amines suitable for use in the present embodiments can include normal, branched, or cyclic C4-C12 alkyl groups bound to the amine nitrogen atom. In some embodiments, the branching can occur on the carbon atom bound to the amine nitrogen atom. In such cases, the secondary amine has significant steric encumbrance at its nitrogen atom. Secondary amines that can be suitable for use in the present processes can include, without limitation, dihexylamine, diisobutylamine, di-t-butylamine, dineopentylamine, di-t-pentylamine, dicyclopentylamine, dicyclohexylamine, and the like. It should also be noted that secondary amines outside the C4-C12 range can also be used, but such secondary amines may have undesirable physical properties such as low boiling points or waxy consistencies. For example, diisopropylamine has a boiling point that may result in evaporative losses in some embodiments. Likewise, heavier secondary amines can be waxy solids that complicate their handling.

As previously noted, it is believed that secondary amines can more strongly coordinate metal ions than do primary amines due to their higher basicity. However, in the case of secondary amines having steric encumbrance adjacent to the amine nitrogen atom, the bonding strength can be weakened relative to an unhindered secondary amine, thereby facilitating its dissociation from metal nanoparticles. Without being bound by theory or mechanism, it is believed that the secondary amines used in the present embodiments can particularly facilitate the dissolution of metal salts in an organic solvent.

In some embodiments, processes described herein utilize a third surfactant that contains a chelating agent. In some embodiments, the chelating agent can be a diamine chelating agent. In some embodiments, a diamine chelating agent can be such that both of its nitrogen atoms are substituted with one or two alkyl groups. That is, such diamine chelating agents can be secondary diamines or tertiary diamines in such embodiments. In some embodiments, the alkyl groups can be C1-C6 alkyl groups. In other embodiments, the alkyl groups can be C1-C4 alkyl groups or C3-C6 alkyl groups. In some embodiments, C3 or higher alkyl groups can be straight or have branched chains. In some embodiments, C3 or higher alkyl groups can be cyclic. Without being bound by theory or mechanism, it is believed that chelating agents, particularly diamine chelating agents, can coordinate a metal ion at two locations, which can stabilize the formation of metal nanoparticles. However, a diamine chelating agent also bridge between two metal centers in some embodiments. Further, it is believed that the third surfactant can play a particular role in formation of the insoluble complex that allows nanoparticle nucleation and growth steps to be separated in the present embodiments. Specifically, it is believed that the third surfactant can beneficially impede growth of large particles of the insoluble complex, ultimately resulting in the formation of metal nanoparticles having a small size range.

In some embodiments, processes described herein can utilize an N,N'-dialkylethylenediamine as the third surfactant, which includes a C1-C4 N,N'-dialkylethylenediamine. The corresponding methylenediamine, propylenediamine, butylenediamine, pentylenediamine or hexylenediamine derivatives can alternatively be used. In some embodiments, the alkyl groups of the C1-C4 N,N'-dialkylethylenediamine or like diamine can be the same, while in other embodiments they can be different. C1-C4 alkyl groups can include methyl, ethyl, propyl, and butyl groups, including normal chain or branched alkyl groups such as isopropyl, isobutyl, s-butyl, and t-butyl groups. Illustrative N,N'-dialkylethylenediamines that can be suitable for use in the present embodiments can include, for example, N,N'-di-t-butylethylenediamine, N,N'-diisopropylethylenediamine, and the like.

In some embodiments, processes described herein can utilize an N,N,N',N'-tetraalkylethylenediamine, which includes a C1-C4 N,N,N',N'-tetraalkylethylenediamine. The corresponding methylenediamine, propylenediamine, butylenediamine, pentylenediamine or hexylenediamine derivatives can also be used. Illustrative N,N,N',N'-tetraalkylethylenediamines that can be suitable for use in the present embodiments can include, for example, N,N,N',N'-tetramethylethylenediamine, N,N,N',N'-tetraethylethylenediamine, and the like.

Other bidentate, tridentate and multidentate ligands can also be employed as the third surfactant instead of a diamine chelating agent. For example, chelating agents such as, for example, diethylenetriamine, triethylenetetramine, and tetraethylenepentamine and their derivatives can also be used.

In various embodiments, a total solution concentration of the first surfactant, the second surfactant, and the third surfactant can range between about 5% to about 30% by weight after all the reaction components have been added. In some embodiments, the first surfactant can be present in an amount ranging between about 2% and about 10% by volume. In some embodiments, the second surfactant can be present in an amount ranging between about 3% and about 15% by volume. In some embodiments, the third surfactant can be present in an amount ranging between about 3% and about 10% by volume.

In various embodiments, about one part of the first surfactant, about two parts of the second surfactant, and about one part of the third surfactant can be used in the presently described processes. It is believed that by controlling the amount of the third surfactant, in particular, it can be possible to produce an insoluble complex of an appropriate size to facilitate the formation of metal nanoparticles having a narrow size distribution. In addition, having a higher ratio of the first surfactant and the second surfactant relative to the third surfactant can allow a suitable amount of these surfactants to be removed from the metal nanoparticles in a soldering application. It should be noted that other ratios of the surfactants can also be used in the present embodiments, and the foregoing ratios should not be considered limiting.

In various embodiments, a metal salt used as a metal source for forming the metal nanoparticles can typically be present in the reaction mixture at a concentration of less than about 2% by volume. Above this concentration, it can be more difficult, though not impossible, to produce small metal nanoparticles having a narrow size distribution. Without being bound by theory or mechanism, it is believed that this difficulty can arise because the nanoparticles are more likely to impact each other due to Brownian motion at higher concentrations, which can cause their fusion with one another. Further, solubility of the metal salt can sometimes be an issue.

After forming the insoluble complex of the metal salt as described above, the insoluble complex can then be reduced using a reducing agent according to the present embodiments. In some embodiments, this can involve combining the insoluble complex with a solution containing the reducing agent, and forming metal nanoparticles from the insoluble complex. In this regard, the present embodiments involve formation of metal nanoparticles from a suspended fine powder, rather than from a solution, which allows the nanoparticle nucleation and growth steps to be separated from one another.

In some embodiments, the reducing agent can be an alkali metal such as, for example, lithium, sodium, or potassium, in the presence of a suitable catalyst. In some embodiments, the reducing agent can be lithium naphthalide, sodium naphthalide, or potassium naphthalide. In other embodiments, the reducing agent can be sodium borohydride, lithium borohydride, tetraalkylammonium borohydrides, or a like hydride reducing agent. In some embodiments, the reducing agent can be ascorbic acid or citric acid.

In some embodiments, the reducing agent can be dissolved in a second solution and added to an insoluble complex of a metal salt that has been formed from a first solution. As noted previously, the solvents for the first solution and the second solution can be the same or different. Suitable solvents for dissolving the reducing agent and performing the reduction have been set forth hereinabove.

In some embodiments, formation of the metal nanoparticles can take place in a reduction that occurs at a temperature below about 50° C. In some embodiments, reacting to form metal nanoparticles can take place at a temperature ranging between about 0° C. and about 50° C. In other embodiments, reacting to form metal nanoparticles can take place at a temperature ranging between about room temperature (e.g., about 25° C.) and about 50° C., or between about 30° C. and about 40° C. in other embodiments. As one of ordinary skill in the art will appreciate, higher temperatures will generally facilitate the faster formation of metal nanoparticles. However, if the temperature becomes too high (e.g., above about 50° C., particularly above about 60° C.) there can be loss of size control, with larger metal nanoparticles being formed (e.g., greater than about 10 nm in diameter). At the higher end of the temperature range, reduction to form metal nanoparticles can take place in as little as about 1 minute. At room temperature or lower, however, longer reaction times of one to two hours can be necessary.

In general, the reaction to form metal nanoparticles can be conducted with a small excess of the reducing agent. In various embodiments, up to about 25% molar excess of the reducing agent can be used relative to the metal salt. In the case of $NaBH_4$, the reducing agent can typically be present at about a 5-20% molar excess relative to the metal salt. Lower amounts of the reducing agent can be used if the solvents and the surfactants are kept rigorously dry so as not decompose excessive amounts of reducing agent.

Figure 2:
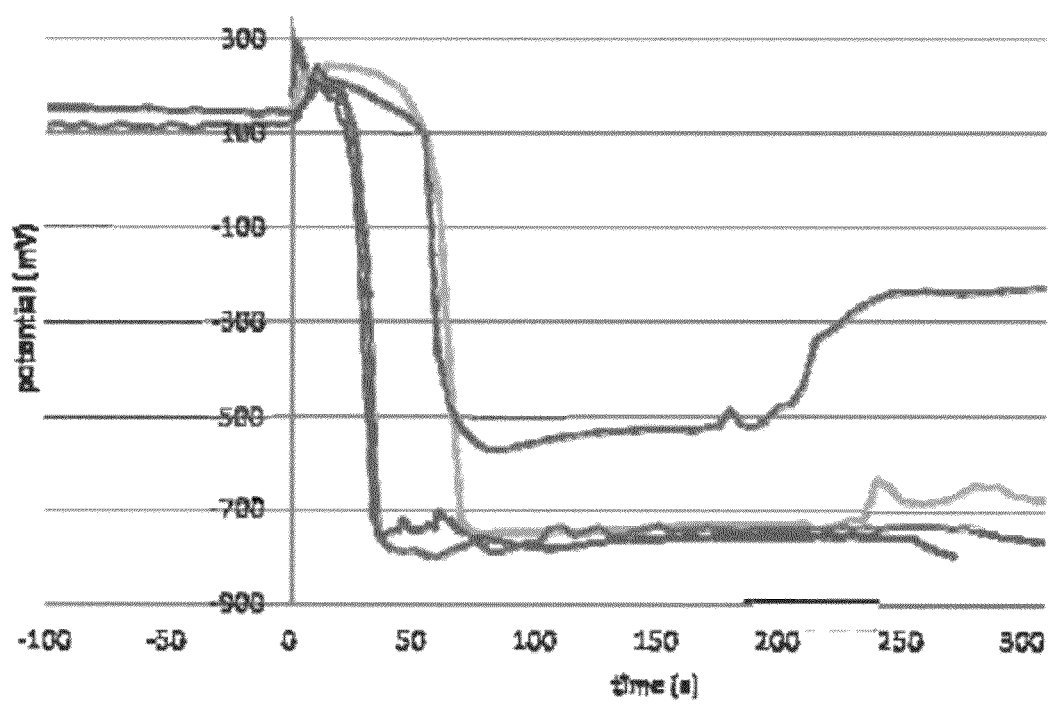
FIG. 2 shows an illustrative plot of potential versus time for several reactions in which copper nanoparticles are formed.

After or during combining the reducing agent with the insoluble complex, the reaction mixture can be monitored for signs of metal nanoparticle formation. These signs can include, for example, a change in color and/or gas evolution. In the case of copper nanoparticles, the formation of nanoparticles is typically accompanied by the appearance of a black color in the reaction mixture as the nanoparticles become of sufficient size. Other colors such as yellow, orange and red can also appear in the reaction mixture during nanoparticle growth. Metal nanoparticle formation can also be monitored colorimetrically, photometrically, or potentiometrically, if desired. FIG. 2 shows an illustrative plot of potential versus time for several reactions in which copper nanoparticles are formed. The initial drop in potential is believed to coincide with a reduction that takes place to form copper nanoparticles. The subsequent rise in potential in some of the curves is believed to be due to the presence of unwanted moisture. Thus, potentiometric reaction monitoring can be used to follow reaction progress and determine when the reaction is complete, in some embodiments.

Once a desired amount of reduction to form metal nanoparticles has taken place, the reaction can be stopped in various ways. In some embodiments, the reducing agent can be quenched with a terminating agent that is reactive with the reducing agent but not substantially reactive with the metal nanoparticles. Illustrative examples of terminating agents can include, for example, aldehydes, ketones, nitriles, organic acids, water, combinations thereof, and the like. More specific examples can include, for example, acetaldehyde, acetonitrile, formic acid, acetic acid, malic acid, and oxalic acid. One of ordinary skill in the art will recognize that by quenching the reducing agent, one can arrest the formation of metal nanoparticles. In some embodiments, the amount of terminating agent can be chosen such that it is stoichiometrically equivalent with the amount of excess reducing agent. Otherwise, oxidation of the metal nanoparticles can occur in some embodiments.

In other embodiments, the formation of metal nanoparticles can be arrested by means other than or in combination with quenching of the reducing agent. For example, in some embodiments, the formation of metal nanoparticles can be arrested by cooling the reaction mixture to about −10° C. or below (e.g., in a liquid nitrogen or dry ice bath), centrifuging the reaction mixture, or combinations thereof. One of ordinary skill in the art will recognize that in the former case, lowering of the reaction temperature to this degree will effectively stop the reduction process. In the latter case, centrifuging the metal nanoparticles can remove them from the reaction mixture in which the reducing agent is present, thereby separating the metal nanoparticles from the excess reducing agent. In some embodiments, centrifuging the metal nanoparticles can take place at a reduced temperature (e.g., below room temperature) so as to minimize the risk of fusion occurring during the centrifugation process. For example, in some embodiments, centrifuging can take place at a temperature ranging between about −10° C. and about 15° C.

In some embodiments, the metal nanoparticles formed by the processes described herein can be used in situ without further isolation. In other embodiments, a work up of the reaction mixture can be performed to purify and isolate the metal nanoparticles. Isolation and purification of the metal nanoparticles can include a series of rinses, sonication, and centrifugation steps. After isolation of the metal nanoparticles from the reaction mixture, various purification processes can optionally be conducted. For example, after isolation of the metal nanoparticles by centrifugation, the mother liquor can be decanted, and the metal nanoparticles can be washed with glyme, THF, or a like solvent to remove excess reducing agent and potential organic side reaction products. Next, water washes can then typically conducted until an $AgNO_3$ test of the wash water is negative for the presence of chloride, which typically takes about 2 to about 5 water washes. In some embodiments, aqueous ammonia washes of the metal nanoparticles can be conducted to remove any unreacted metal salt from the reaction mixture. In such embodiments, a ratio of about 1:4 to about 1:10 ammonia:water can most typically be used.

In some embodiments, after their preparation and isolation, the metal nanoparticles can be stored under conditions that facilitate their long term stability. In some embodiments, the metal nanoparticles can be stored under water or another solvent that contains an antioxidant such as, for example, citric acid, ascorbic acid, butylated hydroxyanisole (BHA), butylated hydroxytoluene (BHT), or propyl gallate (PG). In some embodiments, the metal nanoparticles can be stored under long chain hydrocarbons (e.g. mineral oil), high boiling petroleum ether and the like. In some embodiments, the metal nanoparticles can be stored by sealing a powder of metal nanoparticles with a wax layer and storing in a closed container. In some embodiments, the container housing the metal nanoparticles can be flushed with an inert gas such as nitrogen or argon before being sealed so as to minimize the risk of oxidation during storage. In some embodiments, the storage container can be sealed such as, for example, with a wax layer, shrink wrap, tape, film, and the like.

In some embodiments, the metal nanoparticles can be dispersed in a material that prevents the metal nanoparticles from coming in contact with one another and optionally protects the metal nanoparticles from atmospheric oxygen during storage. Illustrative materials meeting this criteria can include, for example, waxes, long chain amines having greater than about 10 carbon atoms, paraffins, and aromatic compounds such as, for example, phenanthrene, pyrene, or anthracene.

In various embodiments, metal nanoparticles formed by the methods described herein can be about 10 nm or less in size. In other embodiments, the metal nanoparticles can be about 6 nm or less in size or about 5 nm or less in size. In some embodiments, the metal nanoparticles can range from about 1 nm to about 6 nm in size, or from about 3 nm to about 6 nm in size, or from about 3 nm to about 5 nm in size. Although some embodiments described herein can produce metal nanoparticles that are monodisperse in size, in other embodiments, a mixture of metal nanoparticles having different sizes can be produced. For example, in some alternative embodiments, a mixture of metal nanoparticles having a diameter of less than about 10 nm can be mixed with metal nanoparticles of larger diameter.

In some embodiments, copper nanoparticles can be formed by the processes set forth herein, where the copper nanoparticles contain at least some of the first surfactant, the second surfactant, and the third surfactant. The processes of the invention can provide fully dispersed copper nanoparticles that avoid agglomeration and have excellent particle size control at about 10 nm or less in size. In the case of copper nanoparticles having a size of 10 nm or less, more particularly copper nanoparticles having a size ranging between about 3 nm and about 6 nm, the copper nanoparticles can display a fusion temperature of less than about 200° C., which can facilitate their use in soldering applications, as described hereinabove. As also previously noted, in various embodiments, the first surfactant and the second surfactant can be dissociated from copper nanoparticles upon being their being heated to their fusion temperature.

Figure 3:
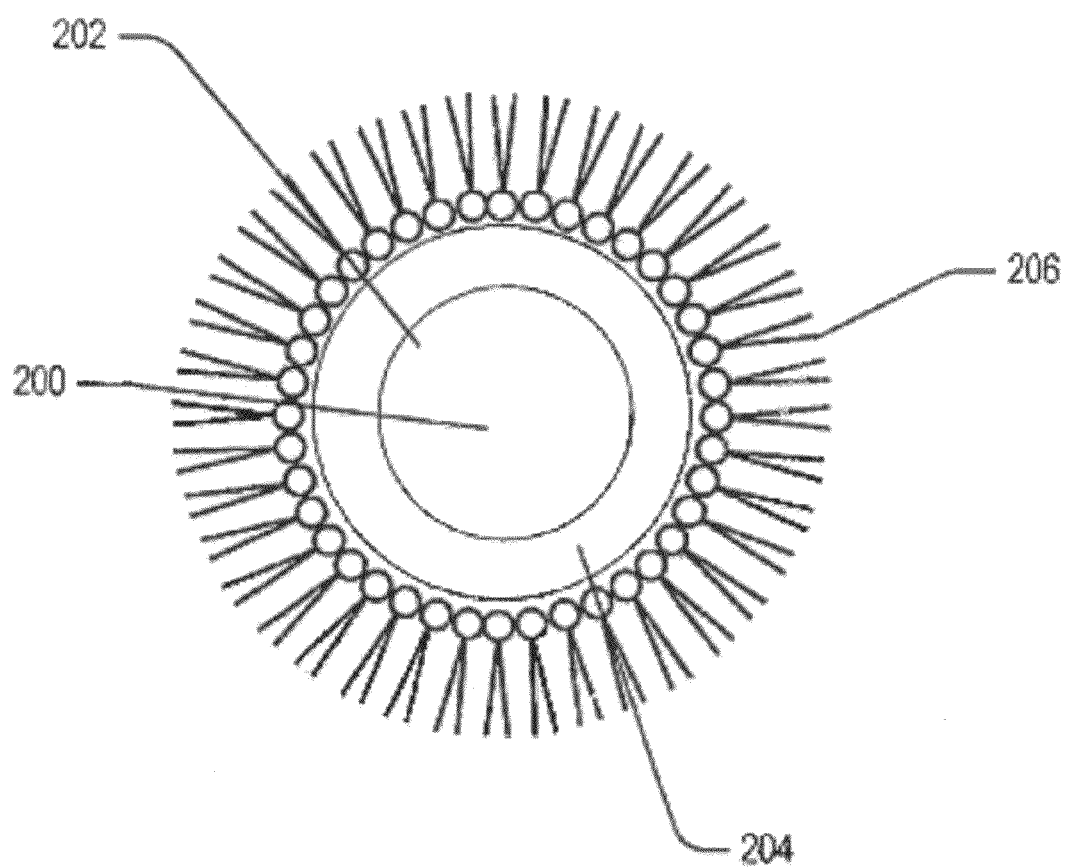
FIG. 3 shows a presumed structure of copper nanoparticles prepared by the processes described herein.

Without being bound by any theory or mechanism, FIG. 3 shows a presumed structure of copper nanoparticles prepared by the processes described herein. Copper nanoparticle 200 shown in FIG. 3 includes a dense core 202, a lower density shell 204, with indications of a smooth transition between the two. The copper nanoparticle include a protective surfactant layer 206 overcoating lower density shell 204, where surfactant layer 206 contains at least one of the first surfactant, the second surfactant, or the third surfactant, including any combination thereof, and helps keep the nanoparticles from agglomerating with one another.

The use of organic surfactants can make the copper nanoparticles soluble in many organic solvents. This advantageously allows their formulation into paint-like slurries and pastes for spray-on, brush on, or other desired methods of application. Suitable solvents can include alcohols (e.g., methanol, ethanol, isopropanol, butanol or hexanol), acetone, toluene, glyme, diglyme and triglyme. Additives such as paraffin wax and organic acids can be used for a variety of applications.

In various embodiments, processes for forming copper nanoparticles can include forming a first solution containing a copper salt, a first surfactant, a second surfactant, and a third surfactant; allowing an insoluble complex of the copper salt to form from the first solution; combining a second solution containing a reducing agent with the insoluble complex, thereby forming a reaction mixture; and forming copper nanoparticles from the insoluble complex. The first surfactant contains a primary amine. The second surfactant contains a secondary amine. The third surfactant contains a diamine chelating agent.

Figure 4:
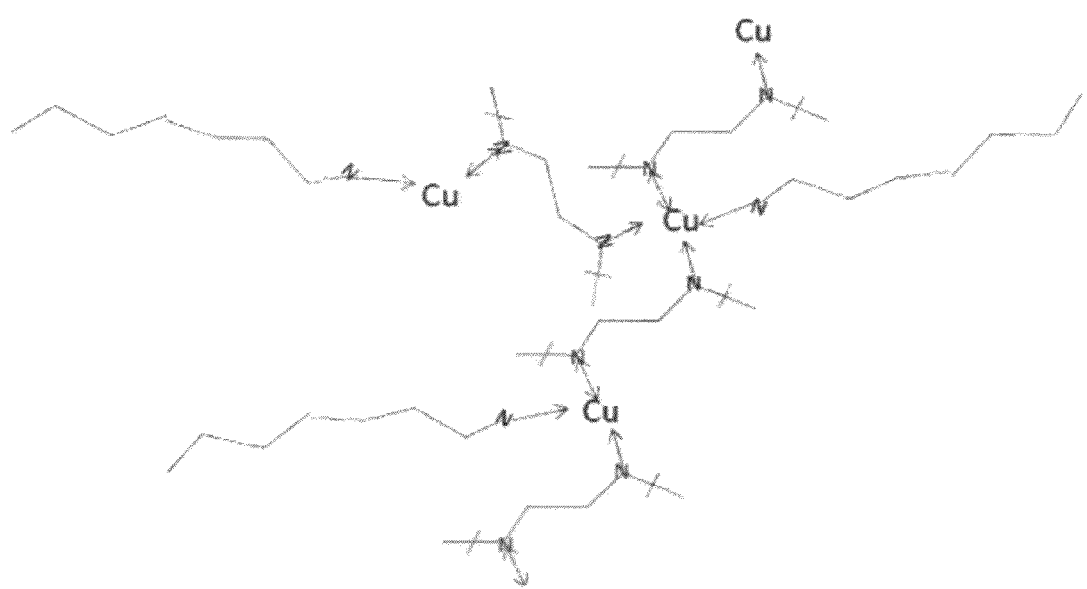
FIG. 4 shows an illustrative schematic demonstrating how a bidentate amine can bridge between metal centers.

In some embodiments, the insoluble complex of the copper salt can be reacted directly with the second solution containing the reducing agent. In other embodiments, the insoluble complex of the copper salt can be isolated and optionally purified, if desired. In some embodiments, the insoluble complex of the copper salt can be a coordination compound of the copper salt and at least one of the first surfactant, the second surfactant, and the third surfactant. In some embodiments, all of the surfactants can be present in the insoluble complex. In other embodiments, the insoluble complex can contain the first surfactant and the second surfactant, the first surfactant and the third surfactant, or the second surfactant and the third surfactant. In still other embodiments, the insoluble complex can contain the three surfactants individually. As noted hereinabove, it is believed that chelate complexes containing the third surfactant can most favorably form the insoluble complex for use in the present embodiments. However, again without being bound by theory or mechanism, it is also possible that the third surfactant can interconnect different metal centers to form an insoluble sol-like three-dimensional network. FIG. 4 shows an illustrative schematic demonstrating how a bidentate amine can bridge between metal centers (e.g., copper). As shown in FIG. 4, the first surfactant and the second surfactant do not bridge between the metal centers.

In some embodiments, formation of the insoluble complex of the copper salt can take place a temperature of at most about 85° C. In some embodiments, formation of copper nanoparticles from the insoluble complex of the copper salt can takes place at a temperature between about 0° C. and about 50° C., or between about 25° C. and about 40° C. in other embodiments.

In some embodiments, the second solution containing the reducing agent can be heated prior to being combined with the insoluble complex of the copper salt. Pre-heating the second solution can help eliminate temperature gradients in the reaction mixture.

In general, the identities of the surfactants and the reaction conditions to form the copper nanoparticles are substantially similar to those set forth above. In some embodiments, the first solution and the second solution can be substantially free of atmospheric oxygen. In some embodiments, the first solution and the second solution can be substantially anhydrous. In some embodiments, the copper salt can be dried by methods such as, for example, heating under vacuum or reacting with a chemical drying agent such as, for example, an orthoester or thionyl chloride. In some embodiments, at least one of the first solution or the second solution can contain diglyme or triglyme as an organic solvent.

In some embodiments, the primary amine of the first surfactant can contain a C4 to C18 primary alkylamine, which can optionally include a branched alkyl group bound to the amine nitrogen atom or be sterically hindered. In some embodiments, the secondary amine of the second surfactant can contain linear, branched, or cyclic C4 to C12 alkyl groups bound to its nitrogen atom. In some embodiments, the diamine chelating agent of the third surfactant can be a secondary diamine or a tertiary diamine, which can contain C1 to C6 linear, branched, or cyclic alkyl groups bound to the nitrogen atoms therein. In some embodiments, C1 to C4 alkyl groups can be present in the diamine. In other embodiments, C3 to C6 alkyl groups can be present in the diamine. Illustrative examples of secondary or tertiary diamine chelating agents can include, but are not limited to, those set forth previously hereinabove. In some embodiments, the first solution contains about one part of the first surfactant, about two parts of the second surfactant, and about one part of the third surfactant.

In some embodiments, the copper salt used in the various processes described herein can be selected from a copper halide, copper nitrate, copper acetate, copper sulfate, copper formate, copper oxide, and various combinations thereof. Other copper (I) or copper (II) salts can be used as well. One of ordinary skill in the art will recognize the benefit of choosing a copper salt having good solubility in the organic solvent being employed. Moreover, the choice of copper salt can be a function of cost and scale. Processes of the present invention when conducted on large scale can benefit from use of inexpensive copper halide salts, for example. In some embodiments, the copper salt can be a copper halide selected from copper chloride, copper bromide, and copper iodide. In more particular embodiments, the copper salt can be copper chloride.

In some embodiments, the copper salt can be in a hydrated form such as, for example, a monohydrate, a dihydrate, a trihydrate, a tetrahydrate, and the like. In some embodiments, the copper salt can be dried before being used to form copper nanoparticles. In some embodiments, drying can be accomplished with heating and/or vacuum. In other embodiments, the water of hydration can be chemically removed by reaction with a drying agent such as, for example, an orthoester or thionyl chloride.

In some embodiments, after forming copper nanoparticles, the present processes can further include quenching the reducing agent with a terminating agent that is reactive with the reducing agent but is not substantially reactive with the copper nanoparticles. Illustrative examples of such terminating agents have been set forth hereinabove. In other various embodiments, the formation of copper nanoparticles can be arrested by cooling the reaction mixture to about −10° C. or below, centrifuging the reaction mixture, or combinations thereof. In some embodiments, the present processes for forming copper nanoparticles can include isolating and optionally purifying the copper nanoparticles. Isolation and purification can involve various centrifugation and washing operations.

Metal nanoparticles fabricated in accordance with the present disclosure can be advantageously used in a variety of applications. In certain applications, the metal nanoparticles generated in accordance with the present disclosure can be used in manufacturing of printed circuits for solar cells or other electronic devices. A typical solar cell assembly can comprise electronics on a rigid single crystal, a polycrystalline substrate, or a suitable flexible substrate. A circuit can be prepared for printing on the substrate, either by directly rendering the circuit on the flexible substrate or by repairing a photo mask for the circuit. Metal nanoparticles that have been fabricated into a paste can be applied to the substrate and "etched" as needed. The "etching" operation can be performed as follows. First, a layer of the metal nanoparticles can be deposited on a surface. Next, a desired conducting line of the printed circuit (circuit lines) can be traced by a heat source such as a laser. The laser causes the metal nanoparticles to heat up to their fusion temperature, thereby evaporating the surfactant on the traced line, leaving behind metal (e.g., copper) in a conductive line. It will be appreciated that the use of lasers to etch conductive lines facilitates precise and thin copper conductive lines useful for dense circuit designs. Next, after tracing with the laser, the remaining metal nanoparticles can be washed off the surface by treating with a suitable solvent. The washed off solution/mixture/paste can then be collected and reused later to deposit a layer of metal nanoparticles (e.g., copper nanoparticles) on another board, since the solvent will still contain metal nanoparticles.

In certain applications, metal nanoparticles can be used to design circuits using inkjet printing technology. In some embodiments, these techniques can be applied on flexible substrates via printed circuit board techniques. The low fusion temperature property of metal nanoparticles can be used in conjunction with the ability to dissolve the metal nanoparticles to create a paste of desired thickness. The paste can be used as the "ink" for the printer. The combined action of inkjet ejection of the "ink" along with heating to the moderate fusion temperature can facilitate direct "printing" of circuits on a suitable printing material (e.g., a special paper or a circuit board). In some embodiments, printing of circuits can take place at or just above room temperature.

Metal nanoparticles of the present disclosure can also have applications in nanoelectronics and photonics materials, such as MEMS and NEMS, in biomaterials, as biomarkers, diagnostics and sensors, in nanomaterials, such as in polymers, textiles, fuel cell layers, composites and solar energy materials. Still further applications of the metal nanoparticles described herein can include their use in antimicrobial formulations, antibiotic and antifungal agents, including their incorporation in coatings, plastics and textiles, and in diet supplements.

It is understood that modifications which do not substantially affect the activity of the various embodiments of this invention are also included within the definition of the invention provided herein. Accordingly, the following Examples are intended to illustrate but not limit the present invention.

EXPERIMENTAL EXAMPLES

Anhydrous $CuCl_2$ was produced as follows: 17 g $CuCl_2 \cdot 2H_2O$ was placed in a 250 ml 3 neck flask. 100 ml thionyl chloride or trimethylorthoformate was added and heated at 50° C. for 1 hr. When gas evolution had ceased, excess thionyl chloride or trimethylorthoformate was removed by distillation and argon flush/vacuum was applied three times.

Example 1

200 ml dry triglyme was placed into a 500 ml 3 neck round bottom flask. 3.9 g of anhydrous copper (II) chloride was added, and the mixture was stirred vigorously for 1-2 hrs. Sparging with argon was conducted for 10 min while heating to 42° C. A plastic syringe and a stainless steel needle was used to add the following surfactants in the order given under positive argon pressure: 12 ml of tert-octylamine, 20 ml diisopropylamine, and 15 ml N,N'-di-tert-butylethylenediamine. The latter surfactant was diluted with 15 ml degassed dry triglyme. The color of the solution turned dark blue after addition of the second surfactant. Stirring was continued for 15-30 min at 42° C. before addition of the third surfactant. Upon addition of the third surfactant, the reaction mixture turned cloudy and assumed a pistachio color. Thereafter, the temperature was reduced to 38-40° C.

A 50 ml round bottom flask was charged with 32-35 ml of dry 2.0 M sodium borohydride solution. This solution was then rapidly transferred via cannula, syringe or addition funnel to the first solution. The pistachio reaction mixture started turning white within 1-2 min. Subsequently, the reaction kept changing color from white, to yellow-brown, to dark brown and finally black at about 3-4 min. At this point, a chemical quenching agent (e.g., acetaldehyde, 4-10 ml) was added to decompose unreacted reducing agent. Immediately thereafter, the reaction mixture was cooled to below −10° C. in a dry ice/acetone bath for 10-30 min.

The reaction mixture was centrifuged at 2500-3100 RPM for 5-10 minutes, which resulted in a black precipitate and a clear supernatant. Centrifugation was repeated if settling was incomplete. The solid was washed with water, optionally containing ammonia, and subsequently centrifuged up to three times. Thereafter, the washes were checked for chloride content using silver nitrate. The copper nanoparticles were then stored in a sealed syringe or a glass vial under argon.

Example 2

The triglyme used in this EXAMPLE had <150 ppm water, as measured by the Karl-Fischer method. In the event that the water content was higher, pre-drying over oven-dried alumina, $CaH_2$ or sodium wire was conducted.

200 ml of dry triglyme was placed into a 500 ml 3 neck round bottom flask, and the following surfactants were added under positive argon pressure using a plastic syringe and a stainless steel needle: 12 ml of tert-octylamine and 20 ml diisopropylamine. 3.9 g of anhydrous copper (II) chloride was then added, and the reaction mixture was stirred vigorously for 1-2 hrs. Sparging with argon was conducted for 10 min while heating to 42° C. After all the $CuCl_2$ dissolved and a deep blue solution formed (15-30 minutes at 42° C.), an addition funnel was used to add 15 ml N,N'-di-tert-butylethylenediamine diluted with 15 ml degassed dry triglyme. Upon slow addition of the third surfactant, the reaction mixture turned cloudy and assumed a pistachio color. Thereafter, the reaction temperature was reduced to 38-40° C.

A 50 ml round bottom flask was charged with 32-35 ml of dry 2.0 M sodium borohydride solution. This solution was then rapidly transferred via cannula, syringe or addition funnel to the first solution. The pistachio reaction mixture started turning white within 1-2 min. Subsequently, the reaction kept changing color from white, to yellow-brown, to dark brown and finally black at about 3-4 min. At this point, a chemical quenching agent (e.g., acetaldehyde, 4-10 ml) was added to decompose unreacted reducing agent. Immediately thereafter, the reaction mixture was cooled to below −10° C. in a dry ice/acetone bath for 10-30 min. Workup was conducted as set forth in EXAMPLE 1.

Example 3

2900 ml dry triglyme was placed into a 5000 ml 5 neck round bottom flask, and 52.5 g of anhydrous copper (II) chloride was added. The reaction mixture was stirred vigorously for 1-2 hrs. Sparging with argon was conducted for 10 min. while heating to 42° C. An addition funnel was used to add the following surfactants in the order given under positive argon pressure: 200 ml of tert-octylamine, 270 ml diisopropylamine, and 200 ml N,N'-di-tert-butylethylenediamine. The latter surfactant was diluted with 200 ml degassed dry triglyme. The color of the solution turned dark blue after addition of the second surfactant. Stirring was continued for 15-30 min at 42° C. Upon addition of the third surfactant, the reaction mixture turned cloudy and assumed a pistachio color. Thereafter, the reaction temperature was reduced to 38-40° C.

A new and clean addition funnel was charged with 445-455 ml of dry 2.0 M sodium borohydride solution. This solution was then rapidly added to the first solution. The pistachio reaction mixture started turning white within 1-2 min. Subsequently, the reaction kept changing color from white, to yellow-brown, to dark brown and finally black at about 3-4 min. At this point, a chemical quenching agent (e.g., acetaldehyde, 50-100 ml) was added to decompose unreacted reducing agent. Immediately thereafter, the reaction mixture was cooled to below −10° C. in liquid nitrogen for 10-30 min. Workup was conducted similarly to that set forth in EXAMPLE 1.

Example 4

17.4 L of dry triglyme was placed into a 50 L 6 neck glass lined reactor. 315 g of anhydrous copper (II) chloride was added, and the reaction mixture was stirred vigorously for 2 hrs. Sparging with argon was conducted for 20 min while heating to 42° C. Direct pressure transfer was used to add the following surfactants in the order given under positive argon pressure: 960 ml of tert-octylamine, 1620 ml diisopropylamine, and 1200 ml N,N'-di-tert-butylethylenediamine. The third surfactant was diluted with 1200 ml degassed dry triglyme. The color of the solution turned dark blue after addition of the second surfactant. Stirring was continued for 30 min. at 42° C. Upon addition of the third surfactant, the reaction mixture turned cloudy and assumed a pistachio color. Thereafter, the temperature was reduced to 38-40° C.

A new and clean addition funnel was charged with 2.7 L of dry 2.0 M sodium borohydride solution. This solution was then rapidly added to the first solution. The pistachio reaction mixture started turning white within 1-2 min. Subsequently, the reaction kept changing color from white, to yellow-brown, to dark brown and finally black at about 3-4 min. At this point, a chemical quenching agent (e.g., acetaldehyde, 50-100 ml) was added to decompose unreacted reducing agent. Immediately thereafter, the reaction mixture was cooled to below −10° C. in liquid nitrogen for 10-30 min. Workup was conducted similarly to that set forth in EXAMPLE 1.

Although the invention has been described with reference to the disclosed embodiments, one having ordinary skill in the art will readily appreciate that these embodiments are only illustrative of the invention. It should be understood that various modifications can be made without departing from the spirit of the invention. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range is specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is the following:

1. A process comprising:
reacting an insoluble complex of a metal salt with a reducing agent in a reaction mixture comprising a first surfactant, a second surfactant, and a third surfactant so as to form metal nanoparticles;
wherein the first surfactant comprises a primary amine, the second surfactant comprises a secondary amine, and the third surfactant comprises a chelating agent comprising an N,N'-diakylethylenediamine or N,N,N',N'-tetraalkylethylenediamine.

2. The process of claim 1, wherein the metal nanoparticles comprise copper nanoparticles.

3. The process of claim 1, wherein the insoluble complex comprises a coordination compound of the metal salt with at least one of the first surfactant, the second surfactant, and the third surfactant.

4. The process of claim 1, wherein the reaction mixture is substantially oxygen free.

5. The process of claim 1, further comprising:
after forming the metal nanoparticles, quenching the reducing agent with a terminating agent that is reactive therewith.

6. The process of claim 5, wherein the terminating agent is selected from the group consisting of an aldehyde, a nitrile, an organic acid, water, and combinations thereof.

7. The process of claim 1, further comprising:
arresting the formation of the metal nanoparticles by performing an action selected from the group consisting of adding a terminating agent to the reaction mixture, cooling the reaction mixture to about −10° C. or below, centrifuging the reaction mixture, and combinations thereof.

8. The process of claim 1, further comprising:
isolating the metal nanoparticles from the reaction mixture.

9. The process of claim 1, wherein the reaction mixture further comprises an organic solvent.

10. The process of claim 9, wherein the organic solvent comprises diglyme or triglyme.

11. The process of claim 1, wherein reacting takes place at a temperature ranging between about 0° C. and about 50° C.

12. The process of claim 1, wherein the insoluble complex is formed at a temperature of at most about 85° C.

13. The process of claim 1, wherein the reducing agent comprises $NaBH_4$.

14. The process of claim 1, wherein the metal nanoparticles range from about 3 nm to about 6 nm in size.

15. The process of claim 1, wherein the reaction mixture comprises about 1 part of the first surfactant, about 2 parts of the second surfactant, and about 1 part of the third surfactant.

16. A process comprising:
   forming a first solution comprising a copper salt, a first surfactant, a second surfactant, and third surfactant;
      wherein the first surfactant comprises a primary amine, the second surfactant comprises a secondary amine, and the third surfactant comprises a chelating agent comprising an N,N'-dialkylethylenediamine or N,N,N',N'-tetraalkylethylenediamine;
   allowing an insoluble complex of the copper salt to form from the first solution;
   combining a second solution comprising a reducing agent with the insoluble complex, thereby forming a reaction mixture; and
   forming copper nanoparticles from the insoluble complex.

17. The process of claim 16, wherein the insoluble complex comprises a coordination compound of the copper salt and at least one of the first surfactant, the second surfactant, and the third surfactant.

18. The process of claim 16, wherein the copper salt is selected from the group consisting of a copper halide, copper nitrate, copper acetate, copper sulfate, copper formate, copper oxide, and combinations thereof.

19. The process of claim 16, wherein the first solution and the second solution are substantially oxygen free.

20. The process of claim 16, further comprising:
   isolating the insoluble complex from the first solution.

21. The process of claim 16, wherein the primary amine comprises a C4 to C18 primary alkylamine.

22. The process of claim 21, wherein the primary alkylamine comprises a branched alkyl group bound to its nitrogen atom.

23. The process of claim 22, wherein the branching occurs on the carbon atom bound to the nitrogen atom.

24. The process of claim 16, wherein the secondary amine comprises branched or cyclic C4 to C12 alkyl groups bound to its nitrogen atom.

25. The process of claim 24, wherein the branching occurs on the carbon atom bound to the nitrogen atom.

26. The process of claim 16, wherein the N,N'-dialkylethylenediamine or N,N,N',N'-tetraalkylethylenediamine comprises C1 to C6 alkyl groups bound to its nitrogen atoms.

27. The process of claim 26, wherein the alkyl groups comprise branched or cyclic C3 to C6 alkyl groups.

28. The process of claim 16, wherein at least one of the first solution or the second solution comprises an organic solvent comprising diglyme or triglyme.

29. The process of claim 16, wherein formation of the insoluble complex takes place at a temperature of at most about 85° C.

30. The process of claim 16, wherein forming the copper nanoparticles takes place at a temperature between about 0° C. and about 50° C.

31. The process of claim 16, further comprising:
   heating the second solution prior to combining with the insoluble complex.

32. The process of claim 16, further comprising:
   after forming the copper nanoparticles, quenching the reducing agent with a terminating agent that is reactive therewith.

33. The process of claim 32, wherein the terminating agent is selected from the group consisting of an aldehyde, a nitrile, an organic acid, water, and combinations thereof.

34. The process of claim 16, further comprising:
   arresting the formation of the copper nanoparticles by performing an action selected from the group consisting of adding a terminating agent to the reaction mixture, cooling the reaction mixture to about −10° C. or below, centrifuging the reaction mixture, and combinations thereof.

35. The process of claim 16, further comprising:
   isolating the copper nanoparticles.

36. The process of claim 16, wherein the reducing agent comprises $NaBH_4$.

37. The process of claim 16, wherein the copper nanoparticles range from about 3 nm to about 6 nm in size.

38. The process of claim 16, wherein the first solution comprises about 1 part of the first surfactant, about 2 parts of the second surfactant, and about 1 part of the third surfactant.

39. The process of claim 16, wherein the insoluble complex is uniformly distributed in the reaction mixture.

40. The process of claim 16, wherein the reaction mixture has a water content of about 200 ppm or lower.

* * * * *